US011791322B2

(12) United States Patent
Kwag et al.

(10) Patent No.: US 11,791,322 B2
(45) Date of Patent: *Oct. 17, 2023

(54) MICRO LED TRANSFER METHOD AND DISPLAY MODULE MANUFACTURED BY THE SAME

(71) Applicant: SAMSUNG ELECTRONICS CO., LTD., Suwon-si (KR)

(72) Inventors: Doyoung Kwag, Suwon-si (KR); Byungchul Kim, Suwon-si (KR); Eunhye Kim, Suwon-si (KR); Sangmoo Park, Suwon-si (KR); Minsub Oh, Seoul (KR); Dongyeob Lee, Suwon-si (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/677,182

(22) Filed: Feb. 22, 2022

(65) Prior Publication Data

US 2022/0181311 A1 Jun. 9, 2022

Related U.S. Application Data

(63) Continuation of application No. 16/866,027, filed on May 4, 2020, now Pat. No. 11,289,462.

(30) Foreign Application Priority Data

May 7, 2019 (KR) .................. 10-2019-0053285

(51) Int. Cl.
*H01L 25/13* (2006.01)
*H01L 33/00* (2010.01)

(52) U.S. Cl.
CPC ............ *H01L 25/13* (2013.01); *H01L 33/005* (2013.01)

(58) Field of Classification Search
CPC ....... H01L 25/13; H01L 33/005; H01L 33/62; H01L 25/0753; H01L 25/167;
(Continued)

(56) References Cited

U.S. PATENT DOCUMENTS 8,646,505 B2   2/2014   Bibl et al.
9,099,687 B2   8/2015   Lee et al.
(Continued)

FOREIGN PATENT DOCUMENTS

CN   109478580 A    3/2019
JP      4396472 B2   1/2010
(Continued)

OTHER PUBLICATIONS

Communication dated Aug. 18, 2020, issued by the International Searching Authority in International Application No. PCT/KR2020/005354 (PCT/ISA/220, 210, 237).
(Continued)

*Primary Examiner* — David Vu
(74) *Attorney, Agent, or Firm* — Sughrue Mion, PLLC

(57) ABSTRACT

A display module is provided. The display module includes: a substrate; a thin film transistor (TFT) layer formed on one surface of the substrate; and a plurality of micro LEDs disposed on the TFT layer. The plurality of micro LEDs are transferred from a transfer substrate to the TFT layer by a laser beam radiated to the transfer substrate through openings of a mask. The openings correspond to regions in which the respective micro LEDs of the transfer substrate are arranged and the openings correspond to a width, a length, or a unit area of each of the micro LEDs.

7 Claims, 12 Drawing Sheets

(58) Field of Classification Search
CPC . H01L 2224/81001; H01L 2224/81191; H01L 2224/95; H01L 2224/95001; H01L 33/0095; H01L 27/156; H01L 21/52; H01L 21/67144; H01L 27/1214
See application file for complete search history.

(56) References Cited

U.S. PATENT DOCUMENTS

| | | |
|---|---|---|
| 10,096,740 B1 | 10/2018 | Chen |
| 10,896,927 B2 | 1/2021 | Zou et al. |
| 2007/0042279 A1 | 2/2007 | Kataoka et al. |
| 2018/0069149 A1 | 3/2018 | Zou et al. |
| 2018/0190633 A1 | 7/2018 | Thompson |
| 2018/0219123 A1 | 8/2018 | Wang et al. |
| 2019/0058081 A1 | 2/2019 | Ahmed et al. |
| 2019/0088820 A1 | 3/2019 | Danesh et al. |
| 2019/0267426 A1 | 8/2019 | Zou et al. |
| 2020/0395521 A1 | 12/2020 | Brodoceanu et al. |

FOREIGN PATENT DOCUMENTS

| | | |
|---|---|---|
| JP | 4848606 B2 | 12/2011 |
| KR | 10-0658143 B1 | 12/2006 |
| KR | 10-2014-0118534 A | 10/2014 |
| KR | 10-1539591 B1 | 7/2015 |
| KR | 10-1605317 B1 | 3/2016 |
| WO | 2018/035668 A1 | 3/2018 |

OTHER PUBLICATIONS

Communication dated Dec. 10, 2021, issued European Patent Office in European Patent Application No. EP 20 80 2873.

MICRO LED TRANSFER METHOD AND DISPLAY MODULE MANUFACTURED BY THE SAME

CROSS-REFERENCE TO RELATED APPLICATION(S)

This application is a Continuation Application of U.S. application Ser. No. 16/866,027, filed May 4, 2020, now U.S. Pat. No. 11,289,462 issued Mar. 29, 2022, which is based on and claims priority under 35 U.S.C. § 119 to Korean Patent Application No. 10-2019-0053285, filed on May 7, 2019, in the Korean Intellectual Property Office, the disclosures of which are incorporated by reference herein in their entireties.

BACKGROUND

Field

The disclosure relates to a display module and a method of manufacturing the display module by transferring a plurality of LEDs from a micro LED transfer substrate to a target substrate.

Description of the Related Art

A plurality of micro light emitting diodes (LEDs) are grown and manufactured in a chip form on a wafer (growth substrate) through an epitaxial process, and the like. The micro LEDs manufactured as described above may be generally transferred onto a relay substrate and then transferred onto a target substrate to configure a display module.

A laser transfer manner may be used to transfer the micro LEDs on the relay substrate to the target substrate by radiating a laser beam onto a rear surface of the relay substrate (a plurality of micro LEDs are arranged on a front surface of the relay substrate) may be used.

However, in a case of transferring the micro LEDs in the laser transfer manner, there is a problem that accuracy of the laser beam is non-uniform. Therefore, when the laser beam is irradiated to a micro LED at a predetermined position on the relay substrate at the time of transferring the micro LEDs, the laser beam also affects micro LEDs in the vicinity of the micro LED at the predetermined position. That is, portions of the micro LEDs in the vicinity of the micro LED at the predetermined position, which are adjacent to the micro LED to be transferred, are separated from the relay substrate, such that the micro LEDs may take a posture inclined with respect to the relay substrate. The micro LEDs taking the inclined posture as described above may not be accurately transferred to designated positions on the target substrate resulting in a significant decrease in transfer efficiency.

To solve such a problem, an optical system such as a homogenizer has been arranged on an irradiation path of the laser beam. However, even with such a measure, it was difficult to improve accuracy of a point at which the laser beam is focused on the relay substrate.

Therefore, a size of the laser beam (a size of the point at which the laser beam is focused on the relay substrate) has increased as compared with a size of the micro LED, and the micro LEDs have been arranged at wide intervals so that the micro LEDs in the vicinity of the micro LED to be transferred other than the micro LED to be transferred are not affected by the laser beam. For this reason, it was difficult to maximize the number of micro LEDs that may be arranged as compared with an area of the relay substrate.

Due to such a problem, the number of times of replacement of the relay substrate in a transfer process has increased, and a working time required for the transfer process has increased, resulting in an increase in a manufacturing cost.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

Provided are a display module and a method of manufacturing the display module using a transfer substrate capable of maximizing the number of micro LEDs that may be arranged on the transfer substrate by forming a screen layer for compensating for accuracy of a laser beam on a rear surface of the transfer substrate to minimize an interval between micro LEDs, and a display module manufactured by the same.

In accordance with an aspect of the disclosure there is provided a display module including: a substrate; a thin film transistor (TFT) layer formed on one surface of the substrate; and a plurality of micro light emitting diodes (LEDs) disposed on the TFT layer. The plurality of micro LEDs are transferred from a transfer substrate to the TFT layer by a laser beam radiated to the transfer substrate through openings of a mask. The openings correspond to regions in which the respective micro LEDs of the transfer substrate are arranged and the openings correspond to a width, a length, or a unit area of each of the micro LEDs.

The mask may be disposed on a first surface of the transfer substrate opposite to a second surface of the transfer substrate on which the plurality of micro LEDs are arranged prior to being transferred from the transfer substrate to the TFT layer by the laser beam.

Each opening of the mask may be arranged at a position corresponding to a corresponding micro LED among the plurality of micro LEDs disposed on the transfer substrate prior to being transferred from the transfer substrate to the TFT layer by the laser beam.

The mask and the plurality of micro LEDs may be arranged on a surface of the transfer substrate, and each micro LED of the transfer substrate is inserted into a corresponding opening of the mask prior to being transferred from the transfer substrate to the TFT layer by the laser beam.

The mask may include a first portion formed on a first surface of the transfer substrate on which the plurality of micro LEDs are arranged prior to being transferred from the transfer substrate to the TFT layer by the laser beam and a second portion formed on a second surface of the transfer substrate.

The mask may include a metal material that reflects or absorbs the laser beam.

The mask may include chromium (Cr) or an Invar alloy (Ni—Fe-based alloy).

In accordance with an aspect of the disclosure there is provided a method of manufacturing a display module by transferring a plurality of micro LEDs arranged on a transfer substrate to a target substrate, including: loading the transfer substrate and the target substrate onto first and second stages of a transfer apparatus, respectively; moving the target substrate and the transfer substrate to transfer positions; and radiating a concentrated laser beam to regions in which the respective micro LEDs of the transfer substrate are arranged through openings of a mask, each of the openings corresponding to a width, a length, or a unit area of each of the micro LEDs arranged on the transfer substrate.

The openings of the mask may be arranged at positions corresponding to the micro LEDs of the transfer substrate.

In accordance with an aspect of the disclosure there is provided a non-transitory computer readable recording medium comprising a program for executing a method of manufacturing a display module by transferring a plurality of micro LEDs arranged on a transfer substrate to a target substrate. The method of manufacturing the display module includes: loading the transfer substrate and the target substrate onto first and second stages of a transfer apparatus, respectively; moving the target substrate and the transfer substrate to transfer positions; and radiating a concentrated laser beam to regions in which the respective micro LEDs of the transfer substrate are arranged through openings of a mask, each of the openings corresponding to a width, a length, or a unit area of each of the micro LEDs arranged on the transfer substrate.

BRIEF DESCRIPTION OF THE DRAWINGS

The above and other aspects, features and advantages of certain embodiments of the present disclosure will be more apparent from the following description taken in conjunction with the accompanying drawings, in which.

DETAILED DESCRIPTION

Figure 1:
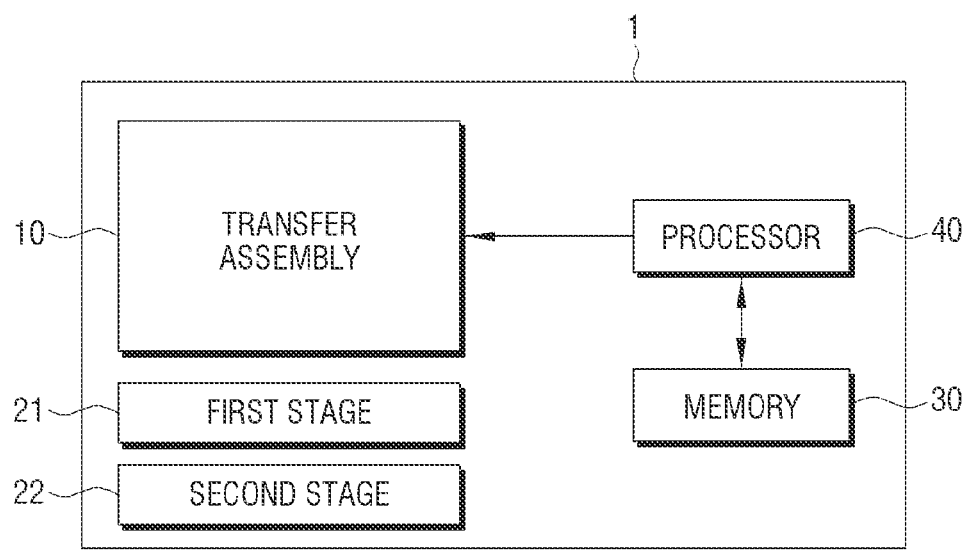
FIG. 1 is a block diagram schematically illustrating a micro light emitting diode (LED) transfer apparatus according to an embodiment.

Embodiments will be described with reference to the accompanying drawings. However, the disclosure is not limited to the embodiments described below, but may be implemented in several forms and may be variously modified. A description for these embodiments is provided only to make the disclosure complete and allow those skilled in the art to which the disclosure pertains to completely recognize the scope of the embodiments. In the accompanying drawings, sizes of components may be enlarged as compared with actual sizes for convenience of explanation, and ratios of the respective components may be exaggerated or reduced.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other expressions describing a relationship between components, for example, "between" and "directly between" may be similarly interpreted.

Terms such as 'first' and 'second' may be used to describe various components, but the components are not to be interpreted to be limited to these terms. These terms may be used only to distinguish one component from other components. For example, a first component may be named a second component and the second component may also be similarly named the first component, without departing from the scope of the disclosure.

Singular forms are intended to include plural forms unless the context clearly indicates otherwise. It may be interpreted that terms "include", "have", or the like, specify the presence of features, numerals, steps, operations, components, parts, and combinations thereof mentioned in the specification, or a combination thereof, but do not preclude the addition of one or more other features, numerals, steps, operations, components, parts, or combinations thereof.

The expression, "at least one of a, b, and c," should be understood as including only a, only b, only c, both a and b, both a and c, both b and c, or all of a, b, and c.

Terms used to describe embodiments may be interpreted as meanings that are generally known to those skilled in the art unless defined otherwise.

A display module manufactured according to embodiments may include a substrate having a thin film transistor (TFT) layer formed on one surface thereof, a plurality of micro light emitting diodes (LEDs) arranged in a state of being electrically connected to the TFT layer, and wirings electrically connecting circuits arranged on a rear surface of the substrate to each other. The TFT layer may be formed integrally with one surface of the substrate through an epitaxial process or may be manufactured in a film form through a separate process and be then attached to one surface of the substrate. The TFT layer may include a TFT circuit and a plurality of terminals to which the micro LEDs are electrically connected. In addition, a plurality of connection pads to which one ends of side wirings that may be formed at edge portions of the substrate are electrically connected, data signal wirings, gate signal wirings, and power supply wirings may be patterned on the TFT layer. Here, the substrate may correspond to a target substrate to be described later, may be any one of a glass substrate, a flexible substrate, or a plastic substrate, and may be referred to as a backplane.

The display module according to embodiments may include a rear substrate electrically connected to a rear surface of the substrate through a flexible printed circuit (FPC). Here, the rear substrate may be formed in a thin film shape or a thin glass shape having a thickness of several tens of μm (for example, 50 μm or less). When the rear substrate is formed in the thin film shape, the rear substrate may be formed of a plastic material, for example, any one of polyimide (PI), polyethylene terephthalate (PET), polyethersulfone (PES), polyethylene naphtalate (PEN), or polycarbonate (PC).

The substrate according to an embodiment may include side wirings formed on edge portions thereof. The side wirings may electrically connect first connection pads formed on edge portions of a front surface of the substrate and second connection pads formed on a rear surface of the substrate to each other. To this end, the side wiring may be formed along the front surface, side end surfaces, and the rear surface of the substrate, and may have one end electrically connected to the first connection pad and the other end electrically connected to the second connection pad. In this case, the side wiring is partially formed on the side end surface of the substrate, and may thus protrude from a side end surface of a TFT substrate by a thickness of the side wiring. In this case, the rear substrate may be electrically connected to the second connection pad through the FPC. A driver integrated circuit (IC) mounted on the rear surface of the TFT substrate may be directly connected to the second connection pad or be indirectly connected to the second connection pad through a separate wiring.

A plurality of display modules configured as described above may be arranged in a tiled type to manufacture a large display apparatus.

A display module according to the disclosure may be a micro light emitting diode (micro LED or μLED) display panel. The micro LED display panel is one of the flat panel display panels, and includes a plurality of inorganic LEDs each having a size of 100 micrometers or less. The micro LED display panel provides a contrast, a response time, and energy efficiency more excellent than those of a liquid crystal display (LCD) panel requiring a backlight unit. Both of the organic LED (OLED) and the micro LED, which is an inorganic light emitting element, have good energy efficiency, but the micro LED has a higher brightness and luminous efficiency and a longer lifespan than those of the OLED. The micro LED may be a semiconductor chip capable of emitting light by oneself when power is supplied thereto. The micro LED has a fast reaction speed, low power, and high luminance. Specifically, the micro LED has a higher efficiency of converting electricity to photons than that of an existing liquid crystal display (LCD) or organic light emitting diode (OLED). That is, the micro LED has a higher "brightness per watt" than that of an existing LCD or OLED display. Therefore, the micro LED may achieve the same brightness as that of the existing LED (whose width, length, and height exceed 100 μm) or OLED with about a half of energy of the existing LED or OLED.

In addition, the micro LED may implement a high resolution and an excellent color, contrast, and brightness, and may thus accurately express a wide range of colors and implement a clear screen even in the outdoors in which sunlight is bright. In addition, the micro LED is resistant to a burn-in phenomenon and generates a small amount of heat, such that a long lifespan of the micro LED is ensured without deformation of the micro LED.

The micro LED according to the disclosure may have a flip chip structure in which anode and cathode electrodes of the micro LED are formed on a first surface and a light emitting surface is formed on a second surface opposite to the first surface on which the anode and cathode electrodes are formed.

In addition, a transfer substrate mentioned in the disclosure is a relay substrate in a state where a plurality of micro LEDs are transferred from a growth substrate in which the plurality of micro LEDs are grown or is sufficient as long as it is a substrate in a state where the micro LEDs may be transferred to a target substrate. Hereinafter, in the disclosure, the transfer substrate and the relay substrate may be used interchangeably.

In the disclosure, the transfer substrate may be a multi-color substrate including at least two of red, green, blue, and white micro LEDs, or a mono-color substrate including only single-color micro LEDs of the red, green, blue, and white micro LEDs.

In the disclosure, when the micro LEDs are laser-transferred from the transfer substrate to the target substrate, a laser beam may be concentrated on a desired point through a mask arranged between the transfer substrate and a laser oscillator. In this case, each of openings of the mask may be formed to correspond to a width, a length or a unit area of each of the micro LEDs. Therefore, the laser beam radiated toward the transfer substrate is accurately radiated only to regions in which respective micro LEDs of the transfer substrate are arranged through the openings of the mask, and the micro LEDs may thus be arranged on the transfer substrate so that an interval (or a pitch) therebetween is closer than that in the related art.

In the disclosure, the transfer of the micro LEDs may refer to not only laser-transferring the micro LEDs from the transfer substrate to the target substrate, but also laser-transferring the micro LEDs from the growth substrate to the transfer substrate. In both of the cases described above, the laser-transfer may be performed using the mask. Here, the growth substrate may be a wafer for epitaxially growing the micro LEDs.

The display module according to the disclosure may be installed in and applied to a wearable device, a portable device, a handheld device, and an electronic product or an electrical component requiring various displays, in a single unit, or may be applied to a display device such as a monitor for a PC, a high resolution TV, a signage, and an electronic display through a plurality of assembly arrangements in a matrix type.

Hereinafter, a structure of a micro LED transfer apparatus according to the disclosure will be described with reference to FIG. 1.

FIG. 1 is a block diagram schematically illustrating a micro LED transfer apparatus according to an embodiment.

Referring to FIG. 1, a micro LED transfer apparatus 1 according to an embodiment may include a transfer assembly 10 for transferring a plurality of micro LEDs arranged in a predetermined arrangement on a transfer substrate 50 (see FIG. 2) to a target substrate 70 (see FIG. 5), first and second stages 21 and 22 arranged adjacent to the transfer assembly 10 and each moving the target substrate and the transfer substrate in X, Y, and Z axis directions, a memory 30 in which characteristic information of each of the plurality of micro LEDs is stored, and a processor 40 controlling the transfer assembly 10 and the first and second stages 21 and 22 to determine positions where the plurality of micro LEDs are to be arranged, respectively, on the transfer substrate 50 on the basis of the stored characteristic information and transfer the plurality of micro LEDs to the determined positions.

The transfer assembly 10 may simultaneously transfer predetermined micro LEDs from a transfer substrate in which the plurality of micro LEDs are arranged to the target substrate in a laser lift-off (LLO) manner.

The transfer assembly 10 may include a laser oscillator for radiating a laser beam toward the transfer substrate 50 to perform a transfer process in the LLO manner. The transfer assembly 10 may further include imaging components for identifying a current location of the transfer substrate and target substrate.

The first stage 21 may include a clamp and one or more motors. The first stage 21 may be configured to detachably clamp the transfer substrate 50 on an upper surface of the first stage 21, and may linearly move along the X axis, the Y axis, and the Z axis and rotate around the Z axis in a state where it clamps the transfer substrate 50. For example, the clamp may be used to detachably clamp the transfer substrate 50, and the one or more motors may control the linear movement along the X axis, the Y axis and the Z axis, and rotation around the Z axis.

The second stage 22 may include a clamp and one or more motors. The second stage 22 may be configured to detachably clamp the target substrate 70 on an upper surface of the second stage 22, and may linearly move along the X axis, the Y axis, and the Z axis and rotate around the Z axis in a state where it clamps the target substrate 70. For example, the clamp may be used to detachably clamp the transfer substrate 50, and the one or more motors may control the linear movement along the X axis, the Y axis and the Z axis, and rotation around the Z axis.

In addition, the micro LED transfer apparatus 1 may include the memory 30 and the processor 40.

The memory 30 may be implemented as at least one of a flash memory type, a read only memory (ROM), a random access memory (RAM), a hard disk type, a multimedia card micro type, or a card type memory (for example, a secure digital (SD) or XD memory).

In addition, the memory 30 may be electrically connected to the processor 40 to transmit a signal and information to the processor 40. Therefore, the memory 30 may store characteristic information of a plurality of micro LEDs that are input or radiated and transmit the stored characteristic information to the processor 40.

The processor 40 controls a general operation of the micro LED transfer apparatus 1. That is, the processor 40 may be electrically connected to the transfer assembly 10 and the first and second stages 21 and 22 to control each component.

For example, the processor 40 may control the transfer assembly 10 and the first and second stages 21 and 22 to transfer a plurality of micro LEDs from growth substrates to a temporary substrate and transfer the plurality of micro LEDs from the temporary substrate to the transfer substrate 50.

In addition, the processor 40 may control the transfer assembly 10 and the first and second stages 21 and 22 to transfer the plurality of micro LEDs arranged on the transfer substrate 50 to the target substrate 70. The disclosure is not limited to controlling all components by a single processor 40, and respective components of the micro LED transfer apparatus 1 may be controlled using a plurality of independent processors, respectively.

Here, the processor 40 may include one or more of a central processing unit (CPU), a controller, an application processor (AP), a communication processor (CP), or an ARM processor.

In addition, the processor 40 may be electrically connected to the memory 30 to use the characteristic information of the plurality of micro LEDs stored in the memory 30. The characteristic information of the plurality of micro LEDs may be data for securing uniformity in an entire arrangement of the plurality of micro LEDs at the time of transferring the plurality of micro LEDs from the growth substrates to the temporary substrate.

Specifically, a process of transferring the plurality of micro LEDs from each growth substrate to the transfer substrate 50 through the temporary substrate using the characteristic information of the plurality of micro LEDs may be as follows.

The processor 40 inspects characteristics of a plurality of micro LEDs each formed on red, green, and blue growth substrates, and analyzes luminance, wavelengths, and the like of the micro LEDs for each region of each growth substrate. An analysis result may be stored in the memory 30. The processor 40 controls some imaging device to capture images of the micro LEDs which are then analyzed.

When the characteristic inspection is completed, the processor 40 simulates a combination of each position for optimal arrangement of a plurality of red, green, and blue micro LEDs in consideration of uniformity at the time of arranging the plurality of red, green, and blue micro LEDs from each growth substrate onto the temporary substrate, and the like, on the basis of the analysis result.

When the optimal arrangement of the plurality of red, green, and blue micro LEDs to be arranged on the temporary substrate is set through the simulation, the processor 40 may form a data map on the basis of the optimal arrangement. A data map may be stored in the memory 30.

Subsequently, the micro LEDs of each growth substrate are sequentially transferred to a single temporary substrate for each color in the LLO manner on the basis of the data map. Alternatively, the micro LEDs of each growth substrate may be transferred to corresponding respective temporary substrates.

The plurality of micro LEDs transferred to the temporary substrate as described above may be transferred to the transfer substrate 50 in the LLO manner.

Hereinafter, a structure of the transfer substrate 50 according to an embodiment will be described with reference to FIGS. 2 to 4.

Figure 2:
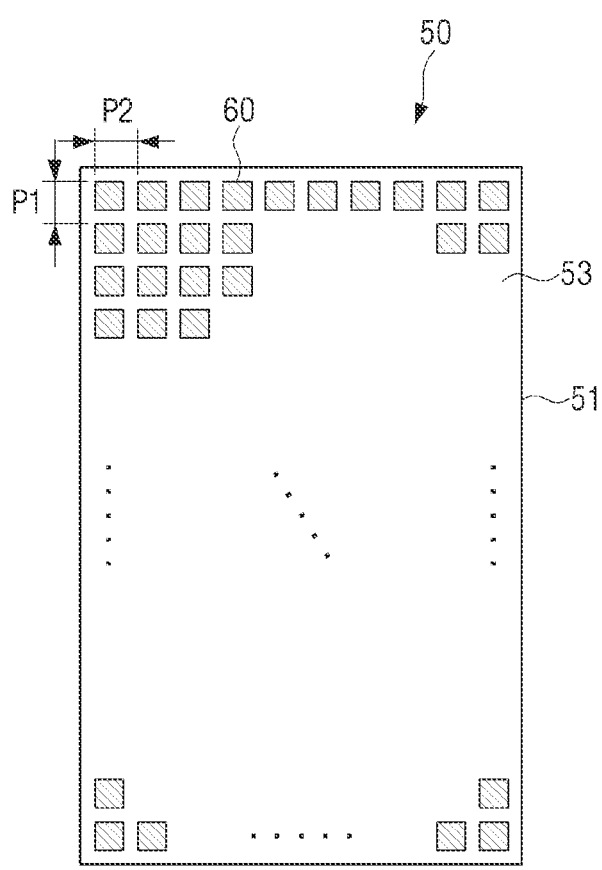
FIG. 2 is a view illustrating one surface of a transfer substrate according to an embodiment.
Figure 3:
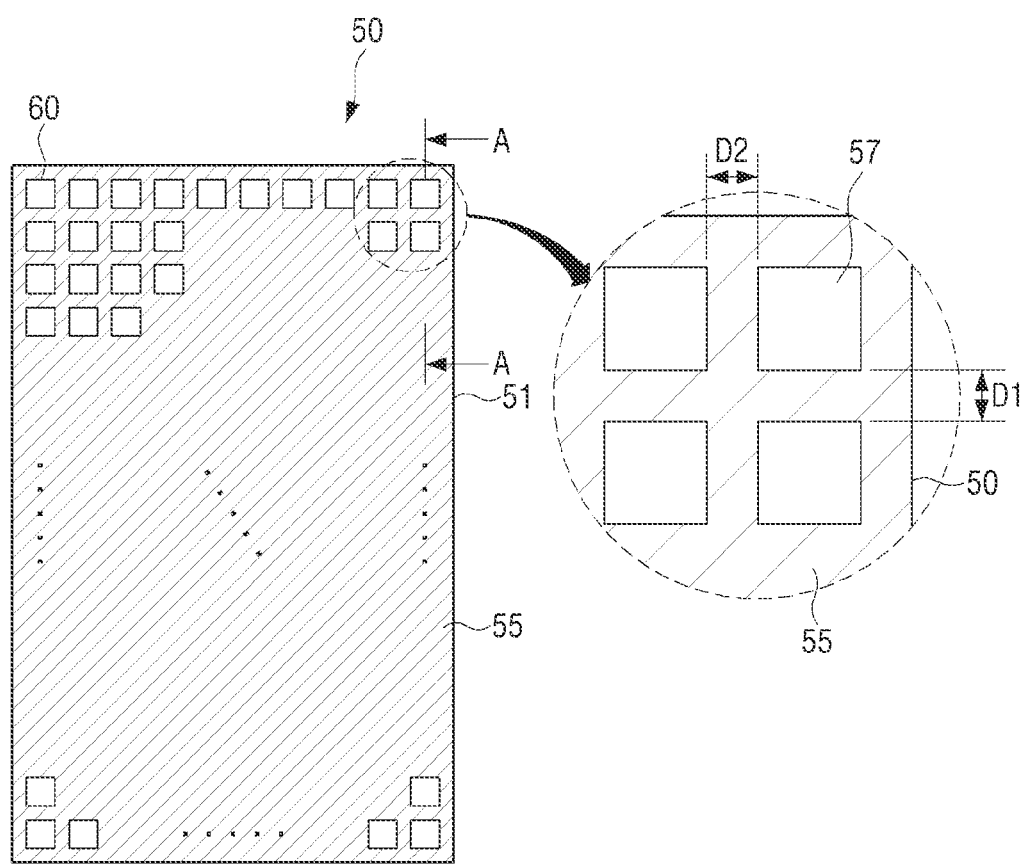
FIG. 3 is a view illustrating the other surface of the transfer substrate according to an embodiment.
Figure 4:
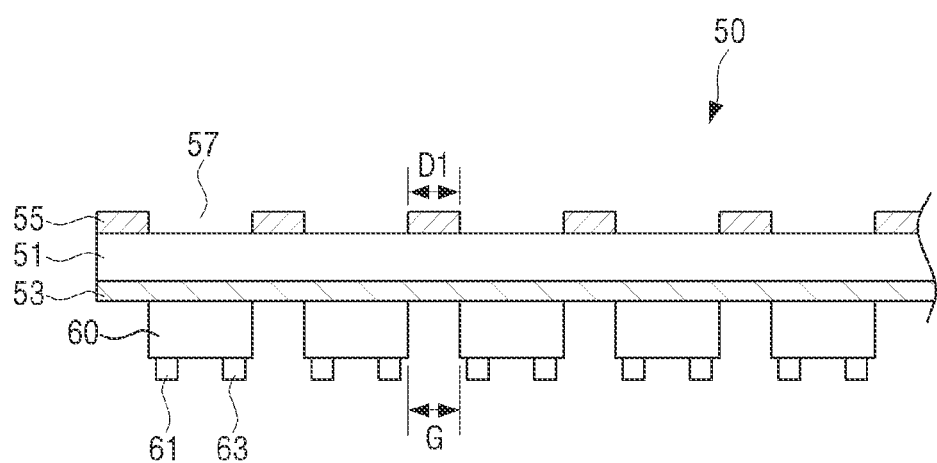
FIG. 4 is a cross-sectional view taken along line A-A of FIG. 3.

FIG. 2 is a view illustrating one surface (or a front surface) of a transfer substrate according to an embodiment, FIG. 3 is a view illustrating the other surface (or a rear surface) of the transfer substrate according to an embodiment, and FIG. 4 is a cross-sectional view taken along line A-A of FIG. 3.

Referring to FIGS. 2 to 4, the transfer substrate 50 may include a glass substrate 51, an adhesive layer 53 formed on a front surface of the glass substrate 51, and a mask 55 formed on a rear surface of the glass substrate 51 and having a constant pattern, and a plurality of micro LEDs 60 arranged on the adhesive layer 53.

The glass substrate 51 may be a transparent substrate formed of sapphire, silicon, or transparent glass to be used in a process to which the LLO manner is applied.

The adhesive layer 53 may be referred to as a dynamic release layer (DRL), and may be formed of a polyimide (PI) material to be easily separated at the time of transferring the micro LEDs to the target substrate 70 in the LLO manner.

The mask 55 may not block a portion of the laser beam transferred to the transfer substrate 50 during the transfer process, and may block the other portion of the laser beam. To selectively block the laser beam as described above, the mask 55 may have a pattern in which an arrangement of the plurality of micro LEDs 60 is considered.

For example, when the plurality of micro LEDs 60 arranged on the front surface of the transfer substrate 50 are arranged in a lattice form at constant pitches P1 and P2 as illustrated in FIG. 2, the mask 55 formed on the rear surface of the transfer substrate 50 may be formed in a pattern of a lattice form as illustrated in FIG. 3. The mask 55 may be coated at a predetermined thickness on the transfer substrate 50 by sputtering in a vacuum chamber.

In this case, the pattern of the mask 55 may have openings 57 formed in regions corresponding to the micro LEDs, respectively. In this case, a size (horizontal and vertical lengths) of the opening 57 may correspond to a size (horizontal and vertical lengths) of the micro LED. In addition, intervals D1 and D2 between the openings 57 may be the same as those between the micro LEDs.

As described above, in the mask 55, the openings 57 having the same size as that of the micro LED are formed in regions to which the laser beam is to be radiated, such that accuracy of the laser beam may be compensated for so that the laser beam may be accurately radiated only to the corresponding micro LED even though a size of the laser beam is slightly larger than that of the micro LED.

In addition, the transfer substrate 50 according to an embodiment may include the mask 55 in which the openings 57 corresponding to the respective micro LEDs 60 are formed, such that an interval G between the micro LEDs arranged on the front surface of the transfer substrate 50 may be narrowed as much as possible. Therefore, in the transfer substrate 50 according to an embodiment, a larger number of micro LEDs may be arranged on the transfer substrate 50 than that in the related art.

The mask 55 may be formed before the plurality of micro LEDs are transferred from the temporary substrate to the transfer substrate. However, the disclosure is not limited thereto, and the mask 55 may be formed on the rear surface of the transfer substrate 50 after the plurality of micro LEDs 60 are transferred from the temporary substrate to the front surface of the transfer substrate 50.

The mask 55 is preferably formed of a material that may reflect or absorb the laser beam to block the laser beam. For example, the mask 55 may be formed of a metal material such as chromium (Cr), an Invar alloy (Ni—Fe alloy), or the like.

In addition, a case where the mask 55 is stacked and formed integrally with the transfer substrate 50 is described in the disclosure, but the disclosure is not limited thereto, and the mask 55 may be formed as a separate mask from the transfer substrate 50. In this case, the separate mask may be arranged in a state where it is in close contact with the rear surface of the transfer substrate 50 at the time of transferring the micro LEDs, or may be arranged at a predetermined distance from the rear surface of the transfer substrate 50.

Hereinafter, a role of the mask 55 at the time of laser-transferring the micro LEDs from the transfer substrate 50 to the target substrate 70 will be described with reference to FIGS. 5 to 7.

Figure 5:
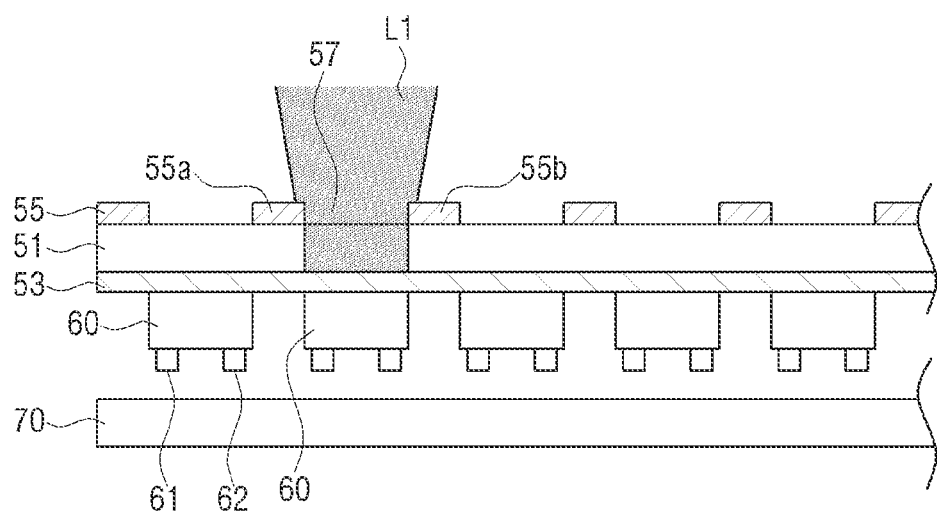
FIG. 5 is a view illustrating an example of compensating for accuracy of a laser beam by a mask when sizes or focusing positions of the laser beam are different from each other.
Figure 6:
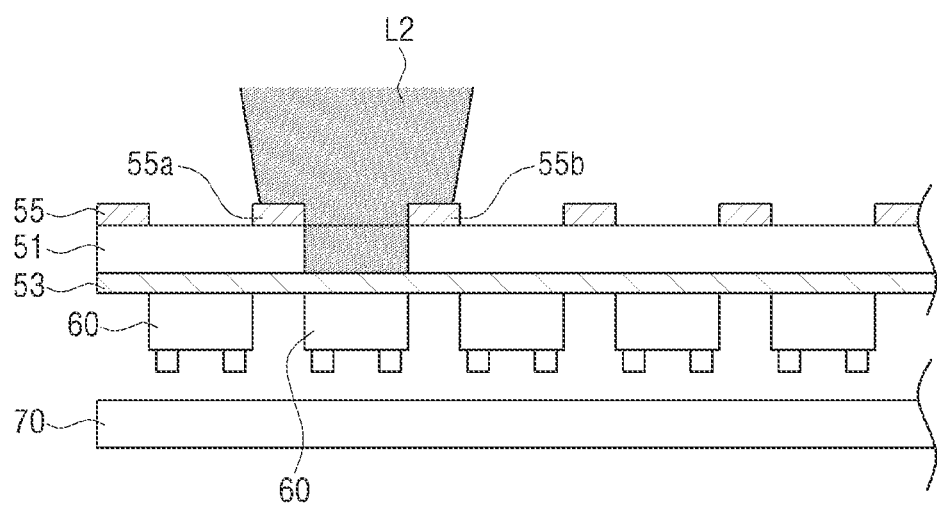
FIG. 6 is a view illustrating an example of compensating for accuracy of a laser beam by a mask when sizes or focusing positions of the laser beam are different from each other.
Figure 7:
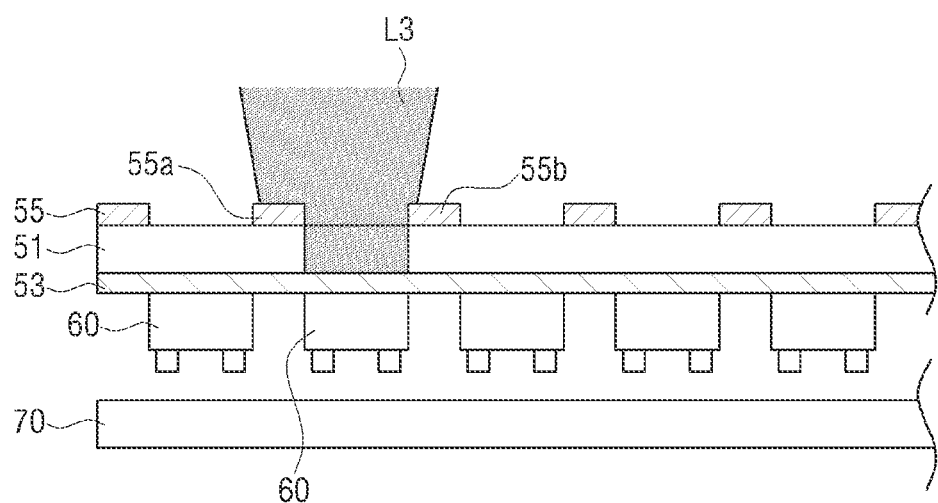
FIG. 7 is a view illustrating an example of compensating for accuracy of a laser beam by a mask when sizes or focusing positions of the laser beam are different from each other.

FIGS. 5 to 7 are views illustrating an example of compensating for accuracy of a laser beam by a mask when sizes or focusing positions of the laser beam are different from each other.

To transfer the plurality of micro LEDs from the transfer substrate 50 to the target substrate 70 through the laser-transfer, the transfer substrate 50 and the target substrate 70 may be set to any positions where the laser beam is radiated by the first and second stages 21 and 22 for each moving the transfer substrate 50 and the target substrate 70.

To transfer the micro LEDs in this state, as illustrated in FIG. 5, a laser beam L1 is radiated toward a predetermined point on the transfer substrate 50. In this case, a size of the radiated laser beam L1 may be larger than that of the opening 57. An edge region of the laser beam L1 is blocked by portions 55a and 55b surrounding the corresponding opening 57.

The laser beam L1 may be radiated to the transfer substrate 50 by a size corresponding to the opening 57. Therefore, the laser beam L1 may be blocked through the mask 55 so that micro LEDs in the vicinity of a micro LED to be transferred other than the micro LED to be transferred are not affected by the laser beam L1.

Referring to FIG. 6, even in a case where a laser beam L2 having a size larger than that of the laser beam L1 illustrated in FIG. 5 is radiated to the transfer substrate 50, an edge region of the laser beam L2 may be blocked by portions 55a and 55b surrounding the corresponding opening 57, and accuracy of the laser beam L2 may thus be compensated for.

Referring to FIG. 7, even in a case where a laser beam L3 having the same size as that of laser beam L1 illustrated in FIG. 5 is eccentric to some extent in relation to the corresponding opening 57, micro LEDs in the vicinity of a micro LED to be transferred other than the micro LED to be transferred may not be affected by the laser beam L3 by portions 55a and 55b surrounding the opening of the mask 55.

The transfer substrate 50 according to an embodiment may compensate for the accuracy of the laser beam through the mask 55 in the transfer process as described above.

Meanwhile, the laser transfer process according to the disclosure described above may be implemented in a form of an application that may be installed on the micro LED transfer apparatus 1 or may be implemented only by software upgrade or hardware upgrade for the micro LED transfer apparatus 1.

In addition, diverse embodiments described above may be performed through an embedded server provided in the micro LED transfer apparatus 1 or an external server of the micro LED transfer apparatus 1.

The diverse embodiments described above may be implemented in a computer or a non-transitory computer readable recording medium using software, hardware, or a combination of software and hardware. In some cases, embodiments described in the disclosure may be implemented by the processor 40 itself. According to a software implementation, embodiments such as procedures and functions described in the specification may be implemented by separate software modules. Each of the software modules may perform one or more functions and operations described in the disclosure.

Computer instructions for performing a processing operation of the micro LED transfer apparatus 1 according to the diverse embodiment described above may be stored in a non-transitory computer-readable medium. The computer instructions stored in the non-transitory computer-readable medium cause a specific device to perform the processing operations of the micro LED transfer apparatus 1 according to the diverse embodiments described above when they are executed by a processor of the specific device.

The non-transitory computer-readable medium is not a medium that stores data for a while, such as a register, a cache, a memory, or the like, but means a medium that semi-permanently stores data and is readable by the device. A specific example of the non-transitory computer-readable medium may include a compact disk (CD), a digital versatile disk (DVD), a hard disk, a Blu-ray disk, a universal serial bus (USB), a memory card, a read only memory (ROM), or the like.

Figure 8:
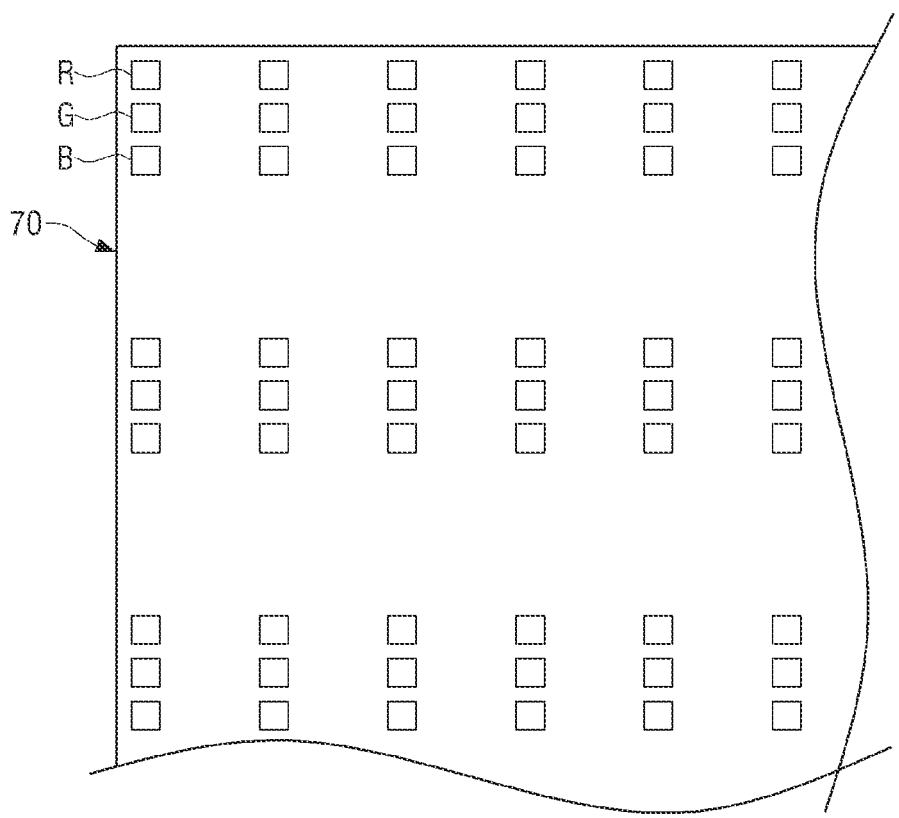
FIG. 8 is a view illustrating a part of a display module to which a plurality of micro LEDs are transferred using a transfer substrate according to an embodiment.

FIG. 8 is a view illustrating an arrangement of the plurality of micro LEDs transferred from the transfer substrate 50 to the target substrate 70.

Referring to FIG. 8, red, green, and blue micro LEDs may form a single group on the target substrate 70, and a plurality of single groups may be arranged to maintain a predetermined pitch therebetween. In this case, the single group may further include a white micro LED.

In addition, the single groups transferred to the target substrate 70 do not need to be limited to a form in which they are arranged in a line as illustrated in FIG. 8, and may be arranged in various forms.

In the disclosure, the target substrate 70 may include a thin film transistor (TFT) layer formed on a front surface thereof on which the plurality of micro LEDs 60 are transferred. Cathode electrodes 61 (see FIG. 5) and anode electrodes 62 (see FIG. 5) of the plurality of micro LEDs 60 transferred to the target substrate 70 may be electrically connected to respective driving circuits provided in the TFT layer at the time of transferring the plurality of micro LEDs 60. In addition, the target substrate 70 may include a wiring electrically connecting the TFT layer and a circuit arranged on a rear surface of the target substrate 70 to each other. In this case, the wiring may be formed on a side surface (or an edge region) of the target substrate 70.

The target substrate 70 including each of the components as described above may be a display module. A plurality of display modules may be connected to each other in various forms such as a straight line form or a lattice form to implement a large display apparatus.

Hereinafter, processes of manufacturing a display module using a transfer substrate according to an embodiment will be sequentially described with reference to FIG. 9.

Figure 9:
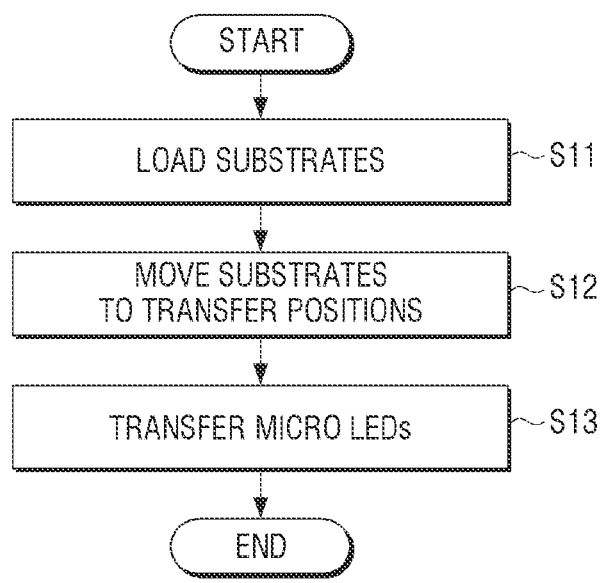
FIG. 9 is a flowchart illustrating a method of manufacturing a display module according to an embodiment.

FIG. 9 is a flowchart illustrating a method of manufacturing a display module according to an embodiment.

First, the transfer substrate 50 is loaded onto the first stage 21, and the target substrate 70 is loaded onto the second stage 22 (S11).

Then, the target substrate 70 and the transfer substrate 50 are moved to predetermined transfer positions by driving the first and second stages 21 and 22 (S12).

Then, the micro LEDs 60 of the transfer substrate 50 are transferred to the target substrate 70 by concentrating and radiating a laser beam on and to regions in which the micro LEDs 60 are arranged on the transfer substrate 50 through the openings 57 of the mask 55 provided on the transfer substrate 50 (S13). In this case, each of the openings 57 of the mask 55 may have a size corresponding to a width, a length or a unit area of each of the micro LEDs arranged on the transfer substrate 50.

Figure 10:
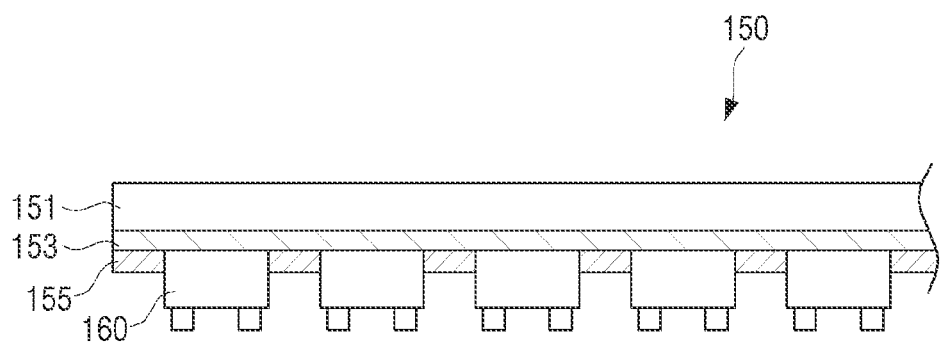
FIG. 10 is a cross-sectional view illustrating a transfer substrate according to another embodiment.
Figure 11:
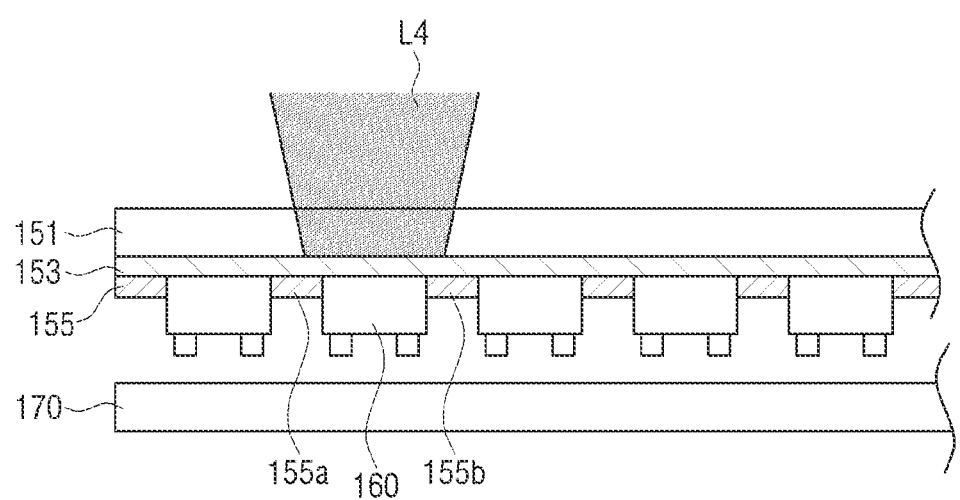
FIG. 11 is a view illustrating an example of performing a transfer process using a transfer substrate according to another embodiment.

FIG. 10 is a cross-sectional view illustrating a transfer substrate according to another embodiment, and FIG. 11 is a view illustrating an example of performing a transfer process using a transfer substrate according to another embodiment.

A case where the mask 55 is formed on the rear surface of the transfer substrate 50 on which the micro LEDs 60 are not present has been described, but the disclosure is not limited thereto, and the mask may also be formed on the front surface of the transfer substrate on which the micro LEDs are arranged.

Referring to FIG. 10, a transfer substrate 150 according to another embodiment may include a transparent substrate 151 and an adhesive layer 153 which is formed on a front surface of the transparent substrate 151 and to which a plurality of micro LEDs are temporarily attached, similar to the transfer substrate 50 described above.

The transfer substrate 150 according to another embodiment may include a mask 155 formed on the adhesive layer 153. In this case, the mask 155 may be applied to the remaining region except for a region occupied by the plurality of micro LEDs 160 on the adhesive layer 153.

The mask 155 may be formed in a pattern of a lattice form, similar to the mask 55 of the transfer substrate 50 described above. In this case, the mask 155 is formed between the respective micro LEDs 160 and outside the outermost micro LEDs, and is not formed in a region occupied by the respective micro LEDs 160.

Referring to FIG. 11, a laser beam L4 is radiated to a predetermined point of the transfer substrate 150 to transfer a predetermined micro LED 160 from the transfer substrate 150 to a target substrate 170.

In this case, even though a size of the laser beam L4 is larger than that of the corresponding micro LED 160, the laser beam L4 is reflected or absorbed by portions 155a and 155b surrounding the corresponding micro LED 160, such that micro LEDs arranged in the vicinity of the corresponding micro LED 160 are not affected by the laser beam L4.

Figure 12:
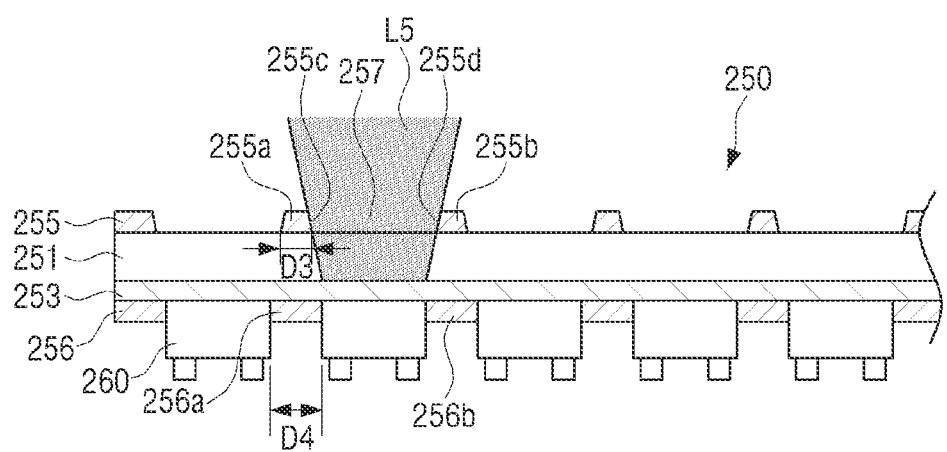
FIG. 12 is a cross-sectional view illustrating a transfer substrate according to still another embodiment.

FIG. 12 is a cross-sectional view illustrating a transfer substrate according to still another embodiment.

Referring to FIG. 12, a transfer substrate 250 according to still another embodiment may include a mask consisting of a first portion 255 formed on a rear surface thereof and a second portion 256 formed on a front surface thereof.

The first portion 255 and the second portion 256 may be formed in patterns of lattice forms corresponding to each other. In this case, the second portion 256 is formed between the respective micro LEDs 260 and outside the outermost micro LEDs, and is not formed in a region occupied by the respective micro LEDs 260.

Each opening 257 of the first portion 255 may be formed to have a size larger than that of the micro LED 260. Therefore, a width D3 of the first portion 255 may be smaller than a width D4 of the second portion 256.

The width D3 of the first portion 255 or the size of the opening 257 of the first portion 255 may be set in consideration of a focusing angle of a laser beam L5 radiated to the transfer substrate 250. In this case, inner surfaces 255c and 255d of the opening 257 are preferably formed to be inclined to have a predetermined angle. However, the disclosure is not limited thereto, and the inner surfaces 255c and 255d of the opening 257 may also be formed without being inclined.

Meanwhile, the width D3 of the first portion 255 is not necessarily smaller than the width D4 of the second portion 256, and may be the same as the width D4 of the second portion 256. Therefore, the width D3 of the first portion 255 may be in a range in which it is equal to or smaller than the width D4 of the second portion 256.

In FIG. 12, reference numeral 251 denotes a transparent substrate, reference numeral 253 denotes an adhesive layer, and reference numeral 270 denotes a target substrate.

Although the diverse embodiments have been individually described hereinabove, the respective embodiments are not necessarily implemented singly, and may also be implemented so that configurations and operations thereof are combined with those of one or more other embodiments.

Although embodiments have been illustrated and described hereinabove, the disclosure is not limited to the specific embodiments described above, but may be variously modified by those skilled in the art to which the disclosure pertains without departing from the scope and spirit of the disclosure claimed in the claims. These modifications should also be understood to fall within the scope of the disclosure.

What is claimed is:
1. A display module comprising:
a substrate;

a thin film transistor (TFT) layer formed on one surface of the substrate; and a plurality of light emitting diodes (LEDs) disposed on the TFT layer, wherein the plurality of LEDs are transferred from a transfer substrate to the TFT layer by a laser beam radiated to the transfer substrate through openings of a mask that is formed integrally with the transfer substrate, and wherein the openings correspond to regions in which the respective LEDs of the transfer substrate are arranged and the openings correspond to a width, a length, or a unit area of each of the LEDs.

2. The display module as claimed in claim 1, wherein the mask is disposed on a first surface of the transfer substrate opposite to a second surface of the transfer substrate on which the plurality of LEDs are arranged prior to being transferred from the transfer substrate to the TFT layer by the laser beam.

3. The display module as claimed in claim 2, wherein each opening of the mask is arranged at a position corresponding to a corresponding LED among the plurality of LEDs disposed on the transfer substrate prior to being transferred from the transfer substrate to the TFT layer by the laser beam.

4. The display module as claimed in claim 1, wherein the mask and the plurality of LEDs are arranged on a surface of the transfer substrate, and wherein each LED of the transfer substrate is inserted into a corresponding opening of the mask prior to being transferred from the transfer substrate to the TFT layer by the laser beam.

5. The display module as claimed in claim 1, wherein the mask includes a first portion formed on a first surface of the transfer substrate on which the plurality of LEDs are arranged prior to being transferred from the transfer substrate to the TFT layer by the laser beam and a second portion formed on a second surface of the transfer substrate.

6. The display module as claimed in claim 1, wherein the mask comprises a metal material that reflects or absorbs the laser beam.

7. The display module as claimed in claim 6, wherein the mask comprises chromium (Cr) or an Invar alloy (Ni—Fe-based alloy).

* * * * *